(12) United States Patent
Uchida

(10) Patent No.: US 9,105,708 B2
(45) Date of Patent: Aug. 11, 2015

(54) WAFER PROCESSING METHOD

(71) Applicant: Disco Corporation, Tokyo (JP)

(72) Inventor: Fumio Uchida, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/013,965

(22) Filed: Aug. 29, 2013

(65) Prior Publication Data

US 2014/0073067 A1    Mar. 13, 2014

(30) Foreign Application Priority Data

Sep. 10, 2012   (JP) ................... 2012-198217

(51) Int. Cl.
| | | |
|---|---|---|
| *H01L 21/78* | (2006.01) | |
| *H01L 21/67* | (2006.01) | |
| *H01L 21/683* | (2006.01) | |
| *H01L 21/66* | (2006.01) | |

(52) U.S. Cl.
CPC .......... *H01L 21/78* (2013.01); *H01L 21/67132* (2013.01); *H01L 21/6835* (2013.01); *H01L 21/6836* (2013.01); *H01L 22/12* (2013.01); *H01L 22/20* (2013.01)

(58) Field of Classification Search
CPC ................ H01L 21/78; H01L 21/6836; H01L 2221/68327; H01L 21/6835; H01L 21/67132
USPC ........... 438/113, 460, 462, 464, 114, 459, 33; 257/E21.599, E21.237
See application file for complete search history.

(56) References Cited

U.S. PATENT DOCUMENTS

| 7,675,153 | B2* | 3/2010 | Kurosawa et al. ............ 257/686 |
|---|---|---|---|
| 8,404,567 | B2* | 3/2013 | Dohmae ....................... 438/464 |
| 2006/0166466 | A1* | 7/2006 | Maki et al. .................... 438/464 |
| 2007/0087524 | A1* | 4/2007 | Montgomery ................ 438/427 |
| 2007/0187802 | A1* | 8/2007 | Kurosawa et al. ............ 257/618 |
| 2008/0213976 | A1* | 9/2008 | Farnworth .................... 438/460 |
| 2009/0298263 | A1* | 12/2009 | Watanabe et al. ............. 438/463 |

FOREIGN PATENT DOCUMENTS

| JP | 2002-066865 | 3/2002 |
|---|---|---|
| JP | 2002-192370 | 7/2002 |

* cited by examiner

*Primary Examiner* — Bac Au
(74) *Attorney, Agent, or Firm* — Greer Burns & Crain, Ltd.

(57) ABSTRACT

A wafer processing method divides a wafer along a plurality of crossing streets formed on the front side of the wafer to thereby partition a plurality of regions where a plurality of devices are respectively formed. The method includes a division groove forming step of cutting the back side of the wafer along each street by using a cutting blade to thereby form a division groove along each street with a predetermined thickness left between the bottom of the division groove and the front side of the wafer, a wafer supporting step of attaching the back side of the wafer to a dicing tape supported by an annular frame, and a wafer dividing step of applying an external force to the wafer attached to the dicing tape to thereby divide the wafer into the individual devices along the streets where the division grooves are respectively formed.

10 Claims, 11 Drawing Sheets

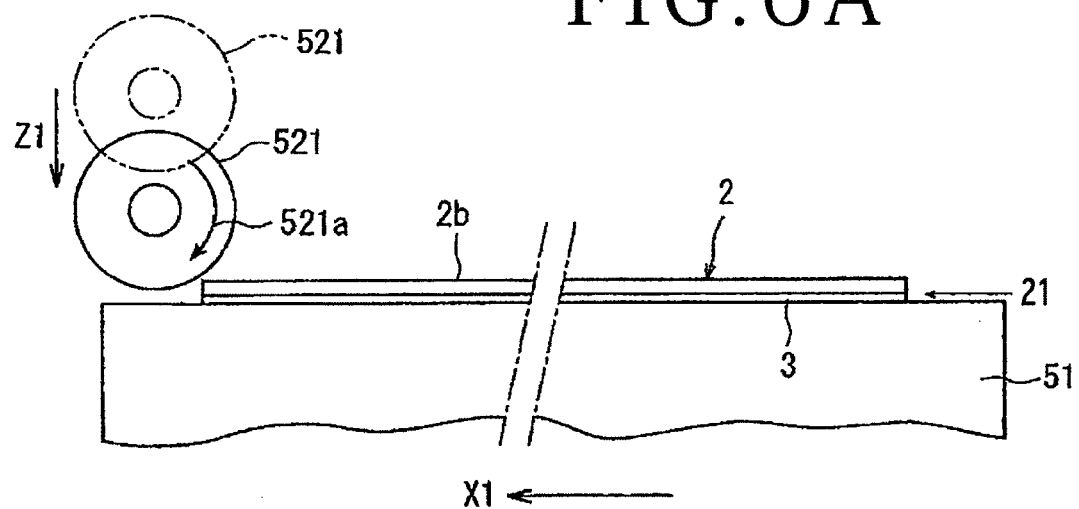
FIG.6A
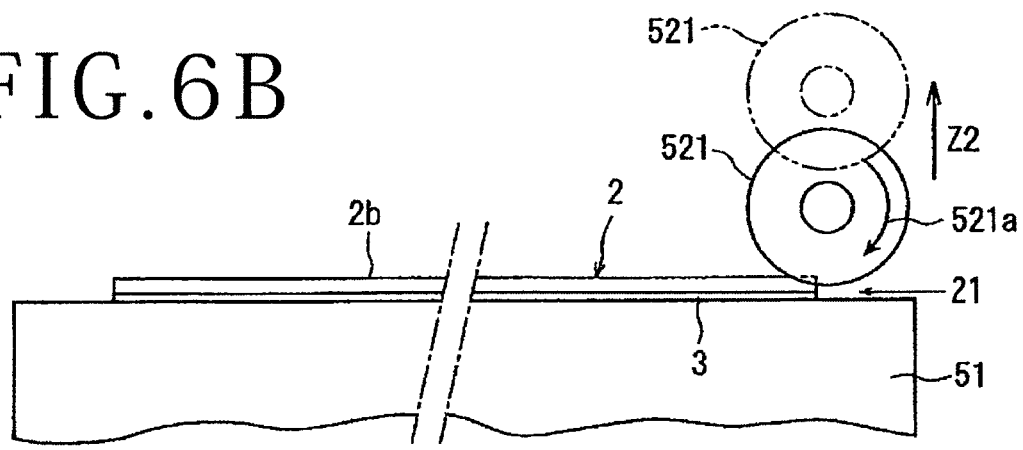
FIG.6B
FIG.6C
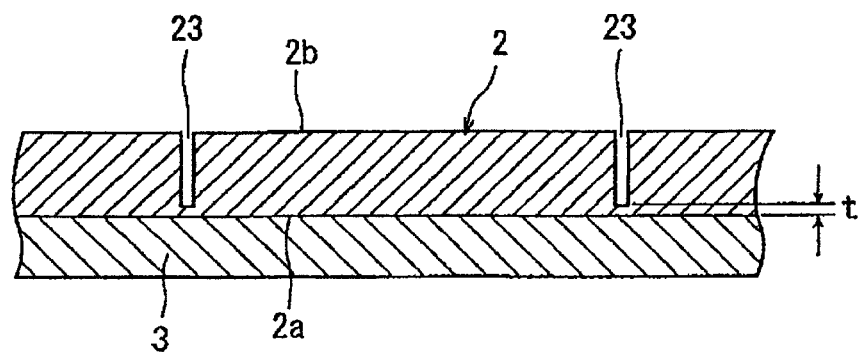

WAFER PROCESSING METHOD

BACKGROUND OF THE INVENTION

1. Field of the Invention

The present invention relates to a wafer processing method of dividing a wafer along a plurality of crossing streets formed on the front side of the wafer to thereby partition a plurality of regions where a plurality of devices are respectively formed, thus obtaining the individual devices.

2. Description of the Related Art

In a semiconductor device fabrication process, a plurality of crossing division lines called streets are formed on the front side of a substantially disk-shaped semiconductor wafer to thereby partition a plurality of regions where a plurality of devices such as ICs and LSIs are respectively formed. The semiconductor wafer is cut along the streets to thereby divide the regions where the devices are formed from each other, thus obtaining the individual devices. Further, an optical device wafer is provided by forming a gallium nitride compound semiconductor layer or the like on the front side of a sapphire substrate or a silicon carbide substrate. The optical device wafer is also cut along the streets to obtain individual optical devices divided from each other, such as light emitting diodes and laser diodes, which are widely used in electric equipment.

Cutting of such a wafer including a semiconductor wafer and an optical device wafer as mentioned above is usually performed by using a cutting apparatus called a dicing saw. The cutting apparatus includes a chuck table for holding a workpiece such as a wafer, cutting means for cutting the workpiece held on the chuck table, and feeding means for relatively moving the chuck table and the cutting means. The cutting means includes a rotating spindle, a cutting blade mounted on the rotating spindle, and a driving mechanism for rotationally driving the rotating spindle. The cutting blade is composed of a disk-shaped base and an annular cutting edge mounted on one side surface of the base along the outer circumference thereof. The cutting edge is formed by bonding diamond abrasive grains having a grain size of about 3 μm to the base by electroforming so as to have a thickness of about 15 μm, for example (see Japanese Patent Laid-open No. 2002-66865, for example).

Since the cutting edge of the cutting blade has a thickness of about 15 μm, each of the division lines for partitioning the devices is required to have a width of about 50 μm. Accordingly, in the case that each device has a size of 1 mm×1 mm, for example, the ratio in area of the streets to the devices becomes large to cause a reduction in productivity. Further, when the wafer is cut by the cutting blade, chipping occurs on the cut surface of the wafer on the lower side thereof, causing deterioration in device quality.

As a method of dividing a platelike workpiece such as a semiconductor wafer, there has recently been tried a laser processing method of applying a pulsed laser beam having a transmission wavelength to the wafer in the condition where the focal point of the pulsed laser beam is set inside the wafer in a subject area to be divided. More specifically, this wafer dividing method using laser processing includes the steps of applying a pulsed laser beam having a transmission wavelength to the wafer from one side of the wafer along the streets in the condition where the focal point of the pulsed laser beam is set inside the wafer to thereby continuously form a modified layer inside the wafer along each street and next applying an external force to the wafer along each street where the modified layer is formed to be reduced in strength, thereby dividing the wafer into the individual devices (see Japanese Patent No. 3408805, for example).

SUMMARY OF THE INVENTION

In the wafer processing method disclosed in Japanese Patent No. 3408805 mentioned above, first modified layers are formed inside the wafer along the streets extending in a first direction and second modified layers are next formed inside the wafer along the streets extending in a second direction perpendicular to the first direction. In this case, at the intersecting portions of the streets extending in the first direction and the streets extending in the second direction, the focal point of the pulsed laser beam set inside the wafer along each street extending in the second direction may be blocked by the first modified layers, so that a sufficient thickness of each second modified layer cannot be obtained at each intersecting portion. As a result, when an external force is applied to the wafer along each street where the corresponding modified layer is formed to thereby divide the wafer into the individual devices, there arises a problem such that chipping may occur on each device.

It is therefore an object of the present invention to provide a wafer processing method which can reduce the width of each street to be formed on the wafer and can divide the wafer without the occurrence of chipping on each device.

In accordance with an aspect of the present invention, there is provided a wafer processing method of dividing a wafer along a plurality of crossing streets formed on the front side of the wafer to thereby partition a plurality of regions where a plurality of devices are respectively formed, the wafer processing method including a protective member attaching step of attaching a protective member to the front side of the wafer; a division groove forming step of cutting the back side of the wafer along each street by using a cutting blade after performing the protective member attaching step to thereby form a division groove along each street with a predetermined thickness left between the bottom of the division groove and the front side of the wafer; a wafer supporting step of attaching the back side of the wafer to a dicing tape supported to an annular frame and peeling the protective member from the front side of the wafer after performing the division groove forming step; and a wafer dividing step of applying an external force to the wafer attached to the dicing tape after performing the wafer supporting step to thereby divide the wafer into the individual devices along the streets where the division grooves are respectively formed.

Preferably, the wafer processing method further includes a back grinding step of grinding the back side of the wafer after performing the protective member attaching step and before performing the division groove forming step to thereby reduce the thickness of the wafer to a finished thickness of each device.

More preferably, the wafer processing method further includes a height data creating step of creating height data by measuring the height of the front side of the wafer in the area corresponding to each street after performing the back grinding step and before performing the division groove forming step; the division groove forming step being performed by controlling the cutting blade according to the height data created in the height data creating step to thereby form the division groove along each street with the predetermined thickness left between the bottom of the division groove and the front side of the wafer.

As described above, the wafer processing method according to the present invention includes the protective member attaching step of attaching a protective member to the front side of the wafer, the division groove forming step of cutting the back side of the wafer along each street by using a cutting blade after performing the protective member attaching step to thereby form a division groove along each street with a predetermined thickness left between the bottom of the division groove and the front side of the wafer, the wafer supporting step of attaching the back side of the wafer to a dicing tape supported to an annular frame and peeling the protective member from the front side of the wafer after performing the division groove forming step, and the wafer dividing step of applying an external force to the wafer attached to the dicing tape after performing the wafer supporting step to thereby divide the wafer into the individual devices along the streets where the division grooves are respectively formed. The wafer is formed with the division grooves extending along the areas corresponding to the streets. Accordingly, when the external force is applied to the wafer attached to the dicing tape in the wafer dividing step, the areas remaining on the front side of the wafer are broken from the division grooves as break start points.

The device layer forming the devices is broken along the streets rather than cut by a cutting blade, so that the width of each street can be reduced. Further, all of the intersecting portions of the division grooves also have a predetermined depth, so that the wafer can be reliably broken into the individual devices without the occurrence of chipping at the intersecting portions.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 6A to 6C are views for illustrating the division groove forming step;

DETAILED DESCRIPTION OF THE PREFERRED EMBODIMENTS

Figure 1:
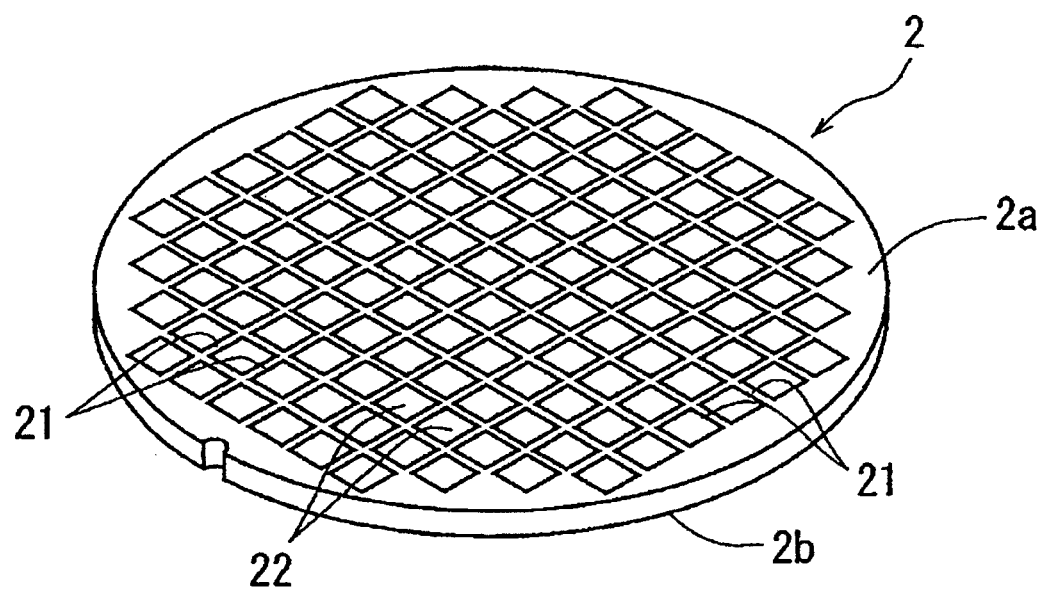
FIG. 1 is a perspective view of a semiconductor wafer to be divided by a wafer processing method according to the present invention.

A preferred embodiment of the wafer processing method according to the present invention will now be described in detail with reference to the attached drawings. FIG. 1 is a perspective view of a semiconductor wafer 2 as a wafer to be processed by the method of the present invention. The semiconductor wafer 2 shown in FIG. 1 is formed from a silicon wafer having a diameter of 200 mm and a thickness of 600 µm, for example. A plurality of crossing streets 21 are formed on the front side 2a of the semiconductor wafer 2 to thereby partition a plurality of rectangular regions where a plurality of devices 22 such as ICs and LSIs are respectively formed. There will now be described a wafer processing method of dividing the semiconductor wafer 2 along the streets 21 to obtain the individual devices 22.

Figure 2A:
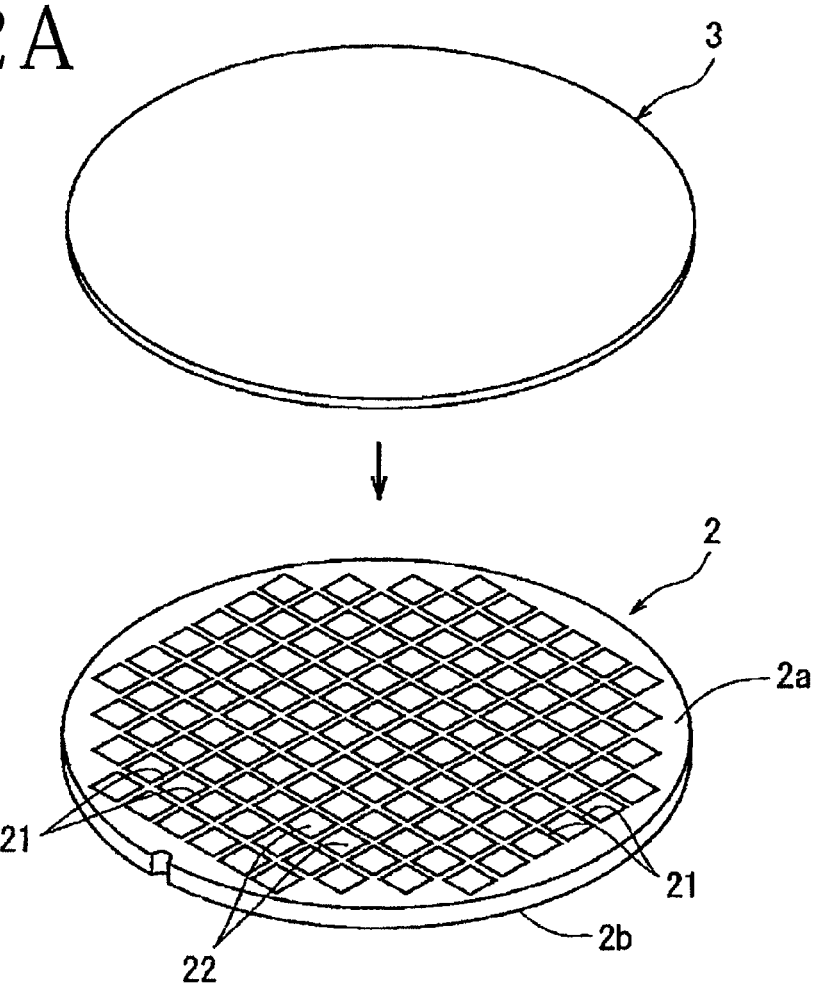
FIGS. 2A and 2B are perspective views for illustrating a protective member attaching step in the wafer processing method according to the present invention.
Figure 2B:
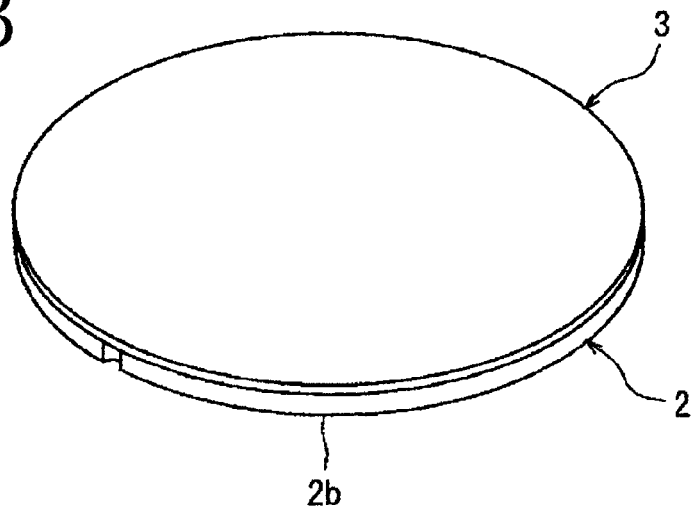

First, a protective member attaching step is performed in such a manner that a protective member is attached to the front side 2a of the semiconductor wafer 2 to protect the devices 22 formed on the front side 2a of the semiconductor wafer 2. More specifically, as shown in FIGS. 2A and 2B, a protective tape 3 as the protective member is attached to the front side 2a of the semiconductor wafer 2. The protective tape 3 is composed of a base sheet and an adhesive layer formed on the base sheet by coating. The base sheet is formed of polyvinyl chloride (PVC) and has a thickness of 100 µm, for example. The adhesive layer is formed of acrylic resin and has a thickness of about 5 µm, for example.

After performing the protective member attaching step mentioned above, a back grinding step is performed in such a manner that the back side 2b of the semiconductor wafer 2 is ground to reduce the thickness of the semiconductor wafer 2 to a finished thickness of each device 22. This back grinding step is performed by using a grinding apparatus 4 shown in FIG. 3. The grinding apparatus 4 shown in FIG. 3 includes a chuck table 41 for holding a workpiece and grinding means 42 for grinding the workpiece held on the chuck table 41. The chuck table 41 has an upper surface as a holding surface for holding the workpiece under suction and is rotatable by a rotational driving mechanism (not shown) in the direction shown by an arrow 41a in FIG. 3. The grinding means 42 includes a spindle housing 421, a rotating spindle 422 rotatably supported in the spindle housing 421 and rotatable by a rotational driving mechanism (not shown), a mounter 423 fixed to the lower end of the rotating spindle 422, and a grinding wheel 424 mounted on the lower surface of the mounter 423. The grinding wheel 424 is composed of an annular base 425 and a plurality of abrasive members 426 fixed to the lower surface of the annular base 425 so as to be arranged annularly. The annular base 425 is mounted to the lower surface of the mounter 423 by a plurality of bolts 427.

Figure 3:
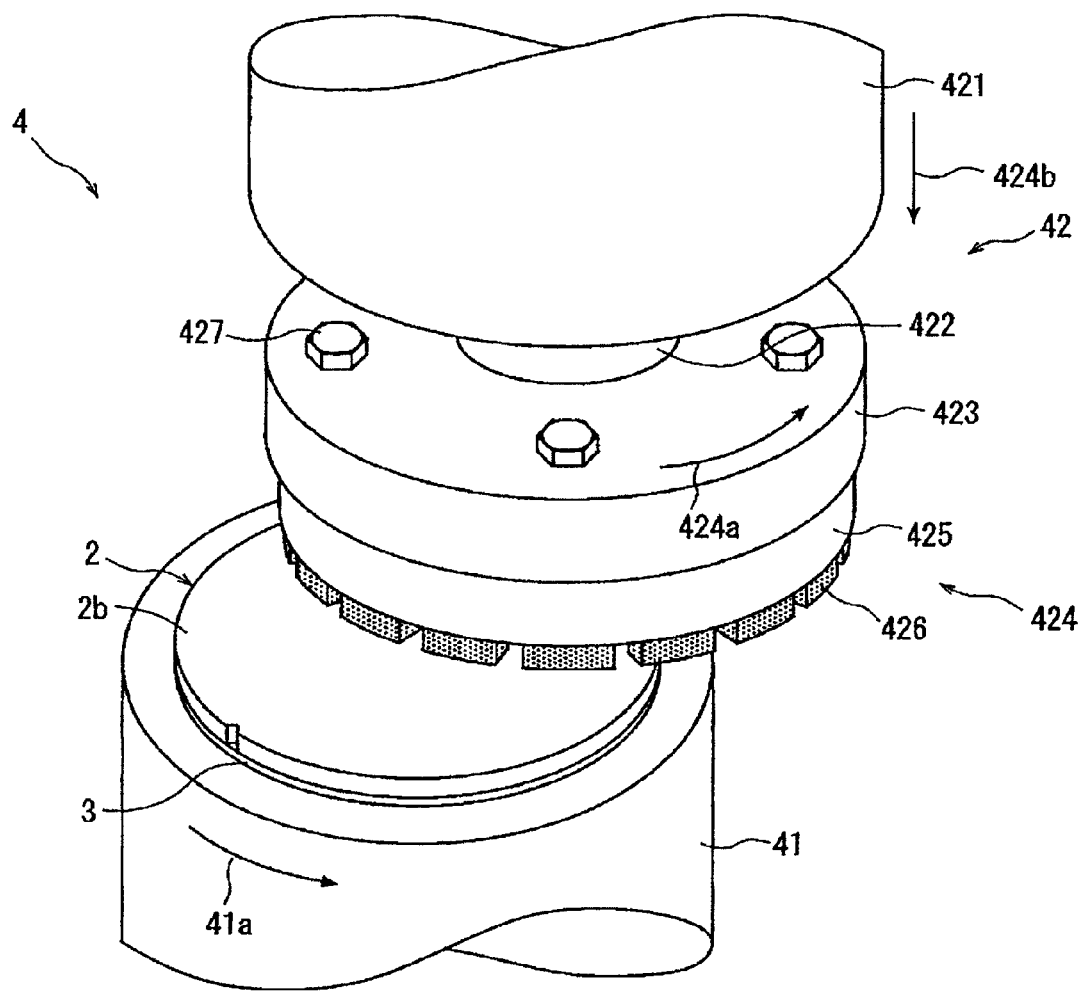
FIG. 3 is a perspective view of an essential part of a grinding apparatus for performing a back grinding step in the wafer processing method according to the present invention.
Figure 4:
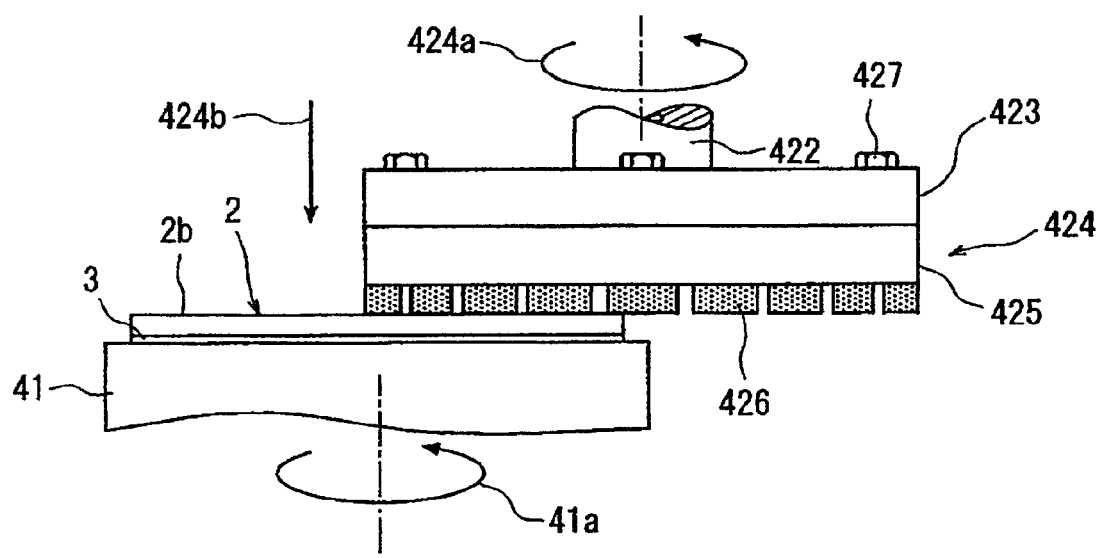
FIG. 4 is a side view for illustrating the back grinding step.

The back grinding step using the grinding apparatus 4 is performed in the following manner. First, the semiconductor wafer 2 is placed on the chuck table 41 in the condition where the protective tape 3 attached to the front side 2a of the semiconductor wafer 2 comes into contact with the upper surface (holding surface) of the chuck table 41 as shown in FIG. 3. Thereafter, suction means (not shown) is operated to hold the semiconductor wafer 2 through the protective tape 3 on the chuck table 41 under suction (wafer holding step). Accordingly, the back side 2b of the semiconductor wafer 2 held on the chuck table 41 is oriented upward. In the condition where the semiconductor wafer 2 is held under suction on the chuck table 41 through the protective tape 3 as mentioned above, the chuck table 41 is rotated at 300 rpm, for example, in the direction shown by the arrow 41a in FIG. 3. At the same time, the grinding wheel 424 of the grinding means 42 is also rotated at 6000 rpm, for example, in the direction shown by an arrow 424a in FIG. 3. Thereafter, the grinding means 42 is lowered to bring the abrasive members 426 into contact with the back side 2b of the semiconductor wafer 2 as a work surface as shown in FIG. 4. Further, the grinding wheel 424 is fed downward (in the direction perpendicular to the holding surface of the chuck table 41) as shown by an arrow 424b in FIGS. 3 and 4 by a predetermined amount at a feed speed of 1 μm/s, for example. As a result, the back side 2b of the semiconductor wafer 2 is ground to reduce the thickness of the semiconductor wafer 2 to a predetermined thickness (e.g., 100 μm).

Figure 5:
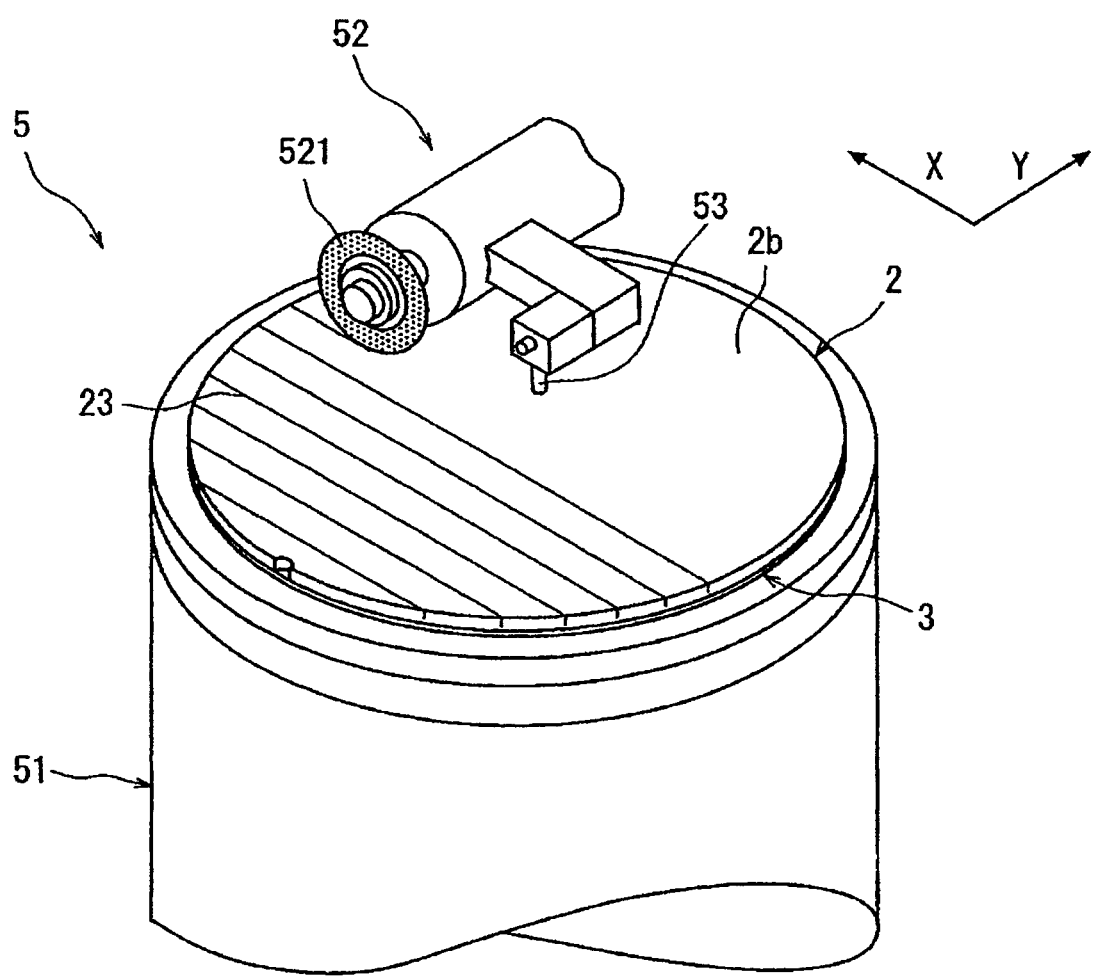
FIG. 5 is a perspective view of an essential part of a cutting apparatus for performing a division groove forming step in the wafer processing method according to the present invention.

After performing the back grinding step as mentioned above, a division groove forming step is performed in such a manner that the back side 2b of the semiconductor wafer 2 is cut along each street 21 by using a cutting blade to thereby form a division groove along each street with a predetermined thickness left between the bottom of the division groove and the front side 2a of the semiconductor wafer 2. This division groove forming step is performed by using a cutting apparatus 5 shown in FIG. 5. The cutting apparatus 5 shown in FIG. 5 includes a chuck table 51 for holding a workpiece, cutting means 52 having a cutting blade 521 for cutting the workpiece held on the chuck table 51, and imaging means 53 for imaging the workpiece held on the chuck table 51. The cutting blade 521 is composed of a disk-shaped base and an annular cutting edge mounted on one side surface of the base along the outer circumference thereof. The cutting edge is formed by bonding diamond abrasive grains having a grain size of about 3 μm to the base by electroforming so as to have a thickness of 11 μm, for example. The imaging means 53 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 53 is transmitted to control means (not shown). The division groove forming step using the cutting apparatus 5 is performed in the following manner. The semiconductor wafer 2 processed by the back grinding step mentioned above is placed on the chuck table 51 of the cutting apparatus 5 in the condition where the protective tape 3 attached to the front side 2a of the semiconductor wafer 2 comes into contact with the upper surface of the chuck table 51 as shown in FIG. 5. By operating suction means (not shown), the semiconductor wafer 2 is held under suction through the protective tape 3 on the chuck table 51 (wafer holding step). Accordingly, the back side 2b of the semiconductor wafer 2 held on the chuck table 51 is oriented upward. The chuck table 51 thus holding the semiconductor wafer 2 under suction is moved to a position directly below the imaging means 53 by feeding means (not shown).

When the chuck table 51 holding the semiconductor wafer 2 is positioned directly below the imaging means 53, an alignment operation is performed by the imaging means 53 and the control means (not shown) to detect a cutting area of the semiconductor wafer 2. More specifically, the imaging means 53 and the control means (not shown) perform image processing such as pattern matching for making the alignment between the cutting blade 521 and the streets 21 extending in a first direction on the semiconductor wafer 2, thereby performing the alignment in the cutting area for the streets 21 extending in the first direction (alignment step). Similarly, the imaging means 53 and the control means (not shown) perform the alignment in the cutting area for the other streets 21 extending in a second direction perpendicular to the first direction on the semiconductor wafer 2. Although the front side 2a of the semiconductor wafer 2 where the streets 21 are formed is oriented downward, the streets 21 can be imaged through the semiconductor wafer 2 formed from a silicon wafer because the imaging means 53 includes the infrared light applying means for applying infrared light, the optical system for capturing the infrared light, and the imaging device (infrared CCD) for outputting an electrical signal corresponding to the infrared light as mentioned above.

After performing the alignment operation for detecting the cutting area of the semiconductor wafer 2 held on the chuck table 51, the chuck table 51 holding the semiconductor wafer 2 is moved to a cutting start position below the cutting blade 521 as shown in FIG. 6A. At this cutting start position, one end (left end as viewed in FIG. 6A) of a predetermined one of the streets 21 extending in the first direction is positioned on the slightly right side of the position directly below the cutting blade 521 as shown in FIG. 6A. Thereafter, the cutting blade 521 is rotated in the direction shown by an arrow 521a in FIG. 6A and simultaneously moved down by a predetermined amount in the direction shown by an arrow Z1 in FIG. 6A from a standby position shown by a phantom line in FIG. 6A to a working position shown by a solid line in FIG. 6A. This movement from the standby position to the working position is performed by operating vertically moving means (not shown) for moving the cutting blade 521 in the direction perpendicular to the upper surface of the chuck table 51. The working position of the cutting blade 521 is set so that the outer circumference of the cutting blade 521 reaches a position above the front side 2a (lower surface as viewed in FIG. 6A) of the semiconductor wafer 2 by an amount of 10 to 15 μm, for example. After moving the cutting blade 521 from the standby position to the working position as mentioned above, the chuck table 51 is moved at a predetermined feed speed (e.g., 50 mm/s) in the direction shown by an arrow X1 in FIG. 6A as rotating the cutting blade 521 in the direction shown by the arrow 521a. When the other end (right end as viewed in FIG. 6B) of the predetermined street 21 extending in the first direction reaches a position on the slightly left side of the position directly below the cutting blade 521 as shown in FIG. 6B, the movement of the chuck table 51 is stopped. Thereafter, the cutting blade 521 is raised to the standby position shown by a phantom line in FIG. 6B in the direction shown by an arrow Z2 in FIG. 6B. As a result, the semiconductor wafer 2 is cut along the predetermined street 21 extending in the first direction to form a division groove 23 with a predetermined thickness t (e.g., 10 to 15 μm) left between the bottom of the division groove 23 and the front side 2a of the semiconductor wafer 2 as shown in FIG. 6C (division groove forming step). The predetermined thickness t is set to a value about 2 to 3 times the thickness (e.g., 5 μm) of the device layer forming the devices 22.

After performing the division groove forming step along all of the streets 21 extending in the first direction on the semiconductor wafer 2, the chuck table 51 is rotated 90° to similarly perform the division groove forming step along all of the other streets 21 extending in the second direction perpendicular to the first direction.

Figure 7:
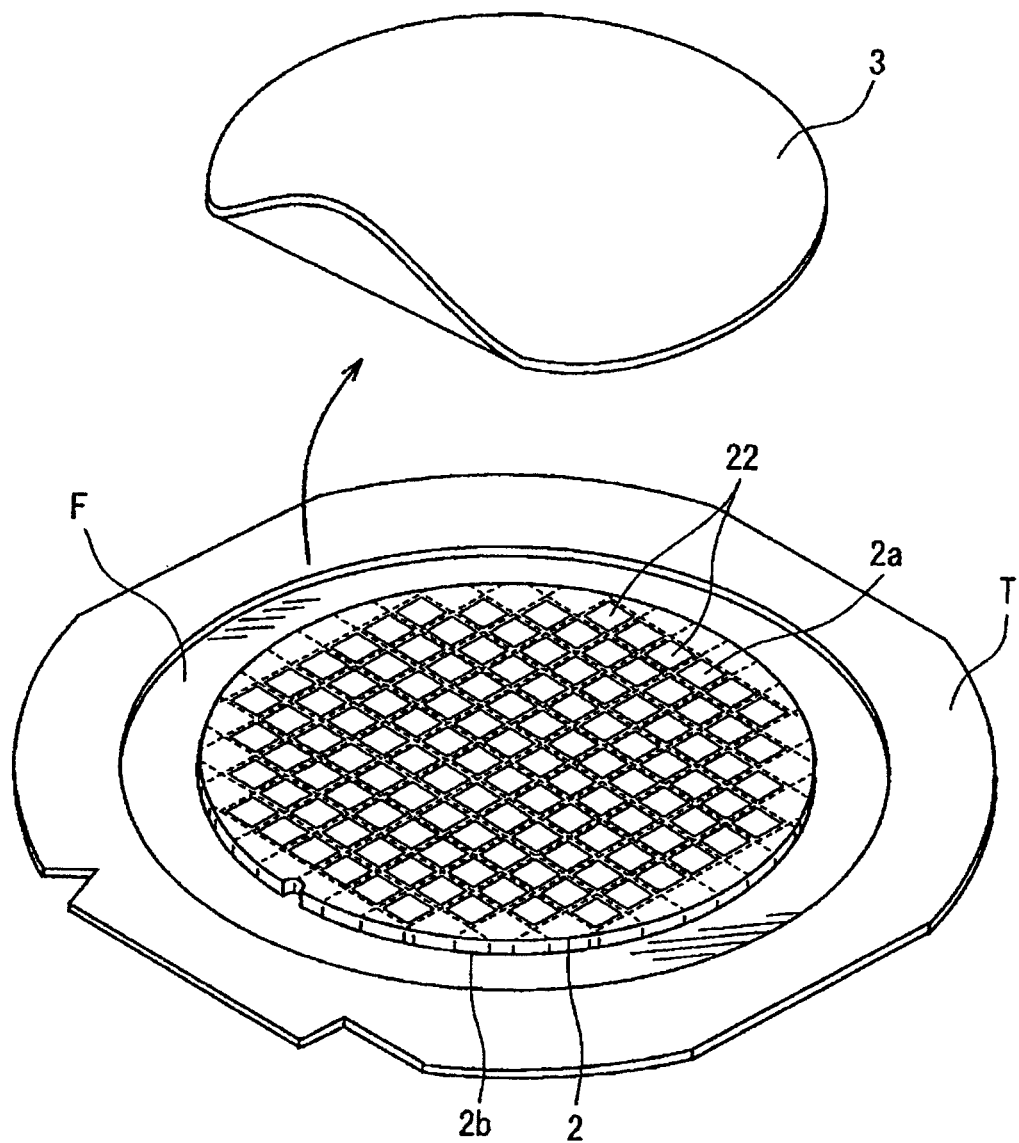
FIG. 7 is a perspective view for illustrating a wafer supporting step in the wafer processing method according to the present invention.

After performing the division groove forming step mentioned above to form the division grooves 23 along all of the streets 21 extending in the first and second directions, a wafer supporting step is performed in such a manner that the back side 2b of the semiconductor wafer 2 is attached to a dicing tape supported to an annular frame and the protective tape 3 is next peeled from the front side 2a of the semiconductor wafer 2. More specifically, as shown in FIG. 7, the back side 2b of the semiconductor wafer 2 processed by the division groove forming step is attached to an expansible dicing tape T supported to an annular frame F in the condition where the protective tape 3 is kept attached to the front side 2a of the semiconductor wafer 2. Accordingly, the protective tape 3 attached to the front side 2a of the semiconductor wafer 2 is oriented upward. Thereafter, the protective tape 3 is peeled from the front side 2a of the semiconductor wafer 2 as shown in FIG. 7.

Figure 8:
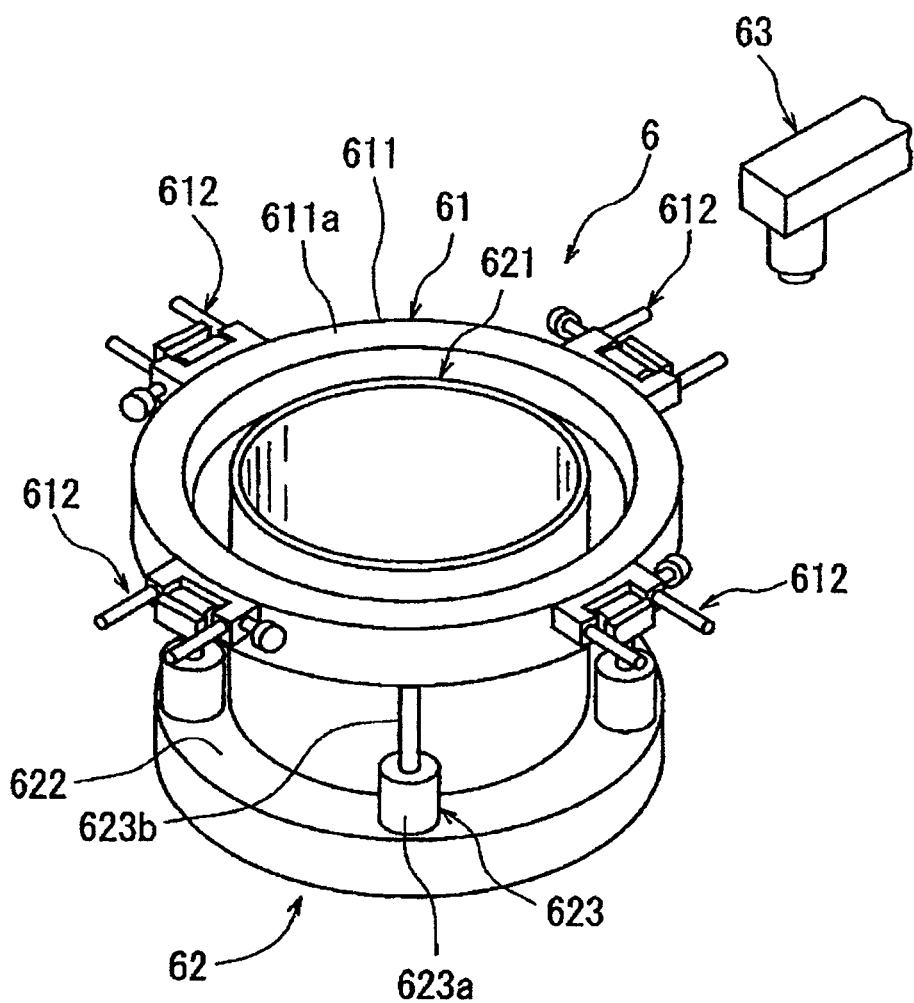
FIG. 8 is a perspective view of a wafer dividing apparatus for performing a wafer dividing step in the wafer processing method according to the present invention.

After performing the wafer supporting step mentioned above, a wafer dividing step is performed in such a manner that the semiconductor wafer 2 supported through the dicing tape T to the annular frame F is divided into the individual devices 22. This wafer dividing step is performed by using a wafer dividing apparatus 6 shown in FIG. 8. The wafer dividing apparatus 6 shown in FIG. 8 includes frame holding means 61 for holding the annular frame F, tape expanding means 62 for expanding the dicing tape T supported to the annular frame F held by the frame holding means 61, and a pickup collet 63. The frame holding means 61 includes an annular frame holding member 611 and a plurality of clamps 612 as fixing means provided on the outer circumference of the frame holding member 611. The upper surface of the frame holding member 611 functions as a mounting surface 611a for mounting the annular frame F thereon. The annular frame F mounted on the mounting surface 611a is fixed to the frame holding member 611 by the clamps 612. The frame holding means 61 is supported by the tape expanding means 62 so as to be vertically movable.

Figure 9A:
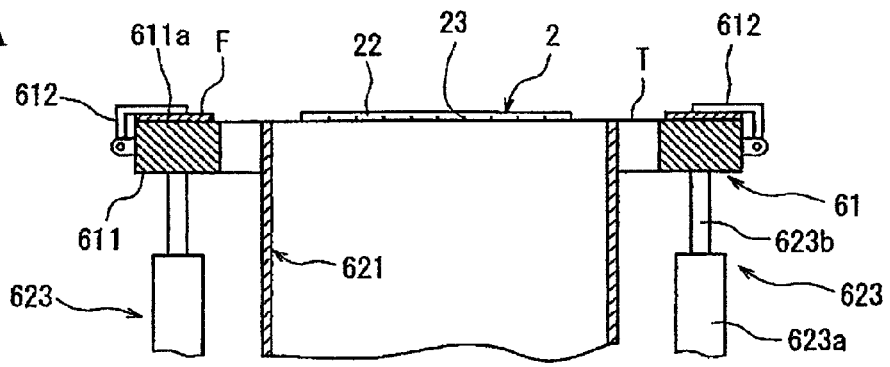
FIGS. 9A to 9D are sectional views for illustrating the wafer dividing step.
Figure 9B:
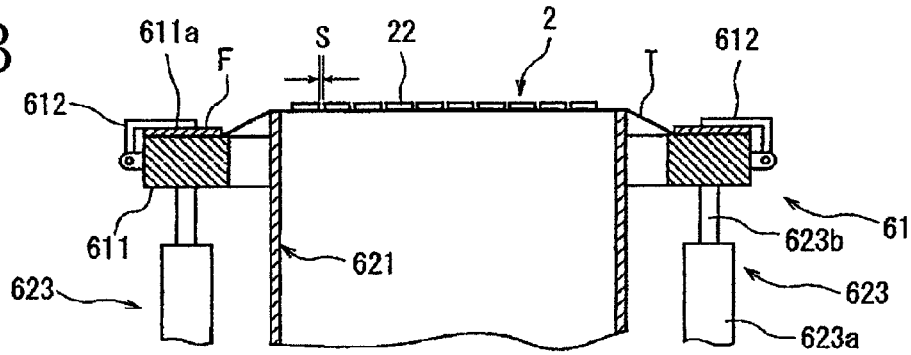

The tape expanding means 62 includes an expanding drum 621 provided inside of the annular frame holding member 611. The expanding drum 621 has an outer diameter smaller than the inner diameter of the annular frame F and an inner diameter larger than the outer diameter of the semiconductor wafer 2 attached to the dicing tape T supported to the annular frame F. The expanding drum 621 has a supporting flange 622 at the lower end of the drum 621. The tape expanding means 62 further includes supporting means 623 for vertically movably supporting the annular frame holding member 611. The supporting means 623 is composed of a plurality of air cylinders 623a provided on the supporting flange 622. Each air cylinder 623a is provided with a piston rod 623b connected to the lower surface of the annular frame holding member 611. The supporting means 623 composed of these plural air cylinders 623a functions to vertically move the annular frame holding member 611 so as to selectively take a reference position where the mounting surface 611a is substantially equal in height to the upper end of the expanding drum 621 as shown in FIG. 9A and an expansion position where the mounting surface 611a is lower in height than the upper end of the expanding drum 621 by a predetermined amount as shown in FIG. 9B.

The wafer dividing step using the wafer dividing apparatus 6 will now be described with reference to FIGS. 9A to 9D. As shown in FIG. 9A, the annular frame F supporting the semiconductor wafer 2 through the dicing tape T is mounted on the mounting surface 611a of the frame holding member 611 of the frame holding means 61 and fixed to the frame holding member 611 by the clamps 612 (frame holding step). At this time, the frame holding member 611 is set at the reference position shown in FIG. 9A. Thereafter, the air cylinders 623a as the supporting means 623 of the tape expanding means 62 are operated to lower the annular frame holding member 611 to the expansion position shown in FIG. 9B. Accordingly, the annular frame F fixed to the mounting surface 611a of the frame holding member 611 is also lowered, so that the dicing tape T supported to the annular frame F comes into abutment against the upper end of the expanding drum 621 and is expanded as shown in FIG. 9B (tape expanding step).

Figure 9C:
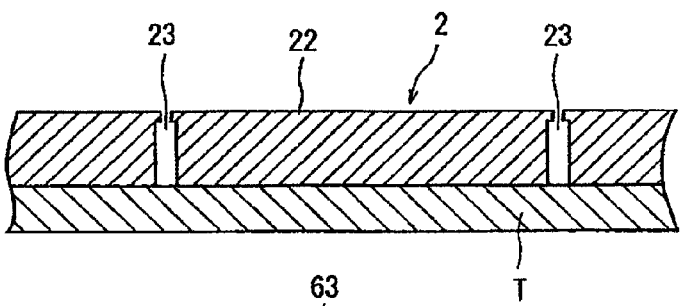

As a result, a tensile force acts on the semiconductor wafer 2 attached to the dicing tape T in the radial direction of the semiconductor wafer 2. As described above, the semiconductor wafer 2 is formed with the division grooves 23 extending along the areas corresponding to the crossing streets 21. Accordingly, when the tensile force acts on the semiconductor wafer 2 in the radial direction thereof as mentioned above, the areas remaining on the front side 2a of the semiconductor wafer 2 are broken from the division grooves 23 as break start points as shown in FIG. 9C (wafer dividing step). The device layer forming the devices 22 is broken along the streets rather than cut by a cutting blade, so that the width of each street 21 can be reduced. Further, all of the intersecting portions of the division grooves 23 also have a predetermined depth, so that the semiconductor wafer 2 can be reliably broken into the individual devices 22 without the occurrence of chipping at the intersecting portions. When the semiconductor wafer 2 is broken as mentioned above, a spacing S is formed between any adjacent ones of the individual devices 22 divided from each other as shown in FIG. 9B.

Figure 9D:
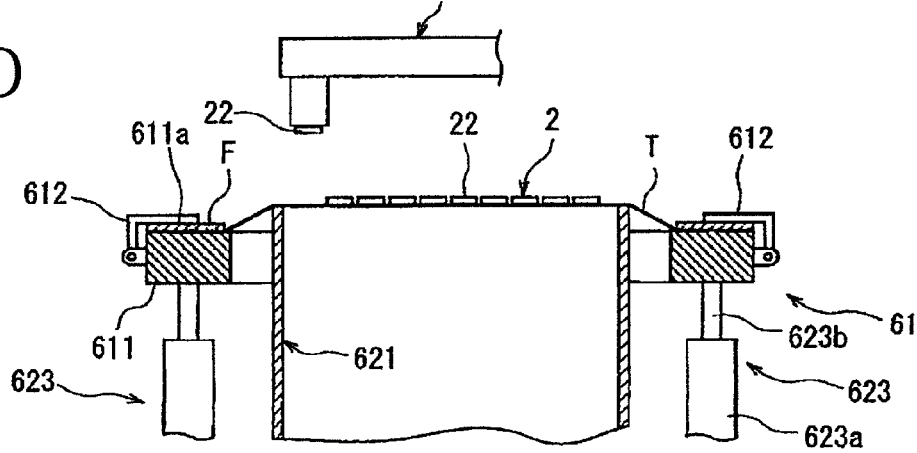

After performing the wafer dividing step as mentioned above, the pickup collet 63 is operated to hold each device 22 under suction and peel it from the dicing tape T, thus individually picking up the devices 22 as shown in FIG. 9D (pickup step). In the wafer dividing step, the spacing S is formed between any adjacent ones of the individual devices 22 attached to the dicing tape T, so that each device 22 can be easily picked up without the contact with its adjacent device 22 in the pickup step.

Figure 10:
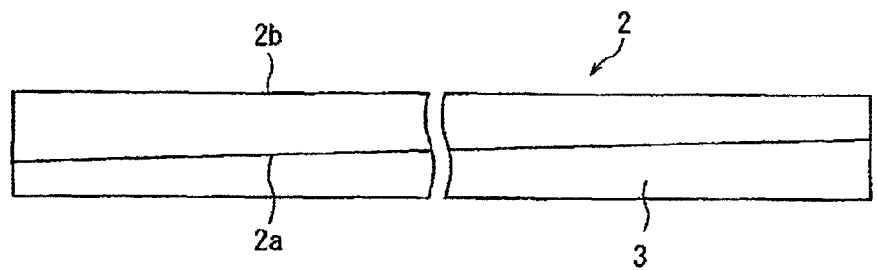
FIG. 10 is a side view exaggeratedly showing the wafer processed by the back grinding step in the case that the thickness of the protective member attached to the front side of the wafer is not uniform.

Another preferred embodiment of the present invention will now be described with reference to FIGS. 10 to 12. There is a case that the thickness of the protective tape 3 is not uniform. As described above, the protective tape 3 is a protective member attached to the front side 2a of the semiconductor wafer 2 to protect the devices 22 formed on the front side 2a of the semiconductor wafer 2. When the thickness of the protective tape 3 is not uniform, the thickness of the semiconductor wafer 2 with the protective tape 3 attached to the front side 2a becomes nonuniform in the back grinding step. That is, as exaggeratedly shown in FIG. 10, the back side 2b (upper surface) of the semiconductor wafer 2 is ground in parallel to the lower surface of the protective tape 3 in the back grinding step, so that the nonuniform thickness of the protective tape 3 causes the nonuniform thickness of the semiconductor wafer 2 in the back grinding step. In the case of performing the division groove forming step to the semiconductor wafer 2 having a nonuniform thickness, there arises a problem such that the predetermined thickness t remaining on the front side 2a of the semiconductor wafer 2 becomes nonuniform, causing the occurrence of chipping or the generation of undivided portions along the streets 21 in the next wafer dividing step.

To solve this problem, the wafer processing method according to this preferred embodiment further includes a height data creating step of creating height data by measuring the height of the front side 2a of the semiconductor wafer 2 in the area corresponding to each street 21 in the condition where the semiconductor wafer 2 is held through the protective tape 3 on the chuck table 51 of the cutting apparatus 5 after performing the back grinding step and before performing the division groove forming step. This height data creating step will now be described with reference to FIGS. 11A and 11B. This height data creating step is performed by using noncontact type height measuring means 55. The noncontact type height measuring means 55 may be provided by a known noncontact type height measuring apparatus for applying detection light having a transmission wavelength to the semiconductor wafer 2 and measuring the height of the front side 2a of the semiconductor wafer 2 according to reflection light reflected on the front side 2a (lower surface) of the semiconductor wafer 2.

Figure 11A:
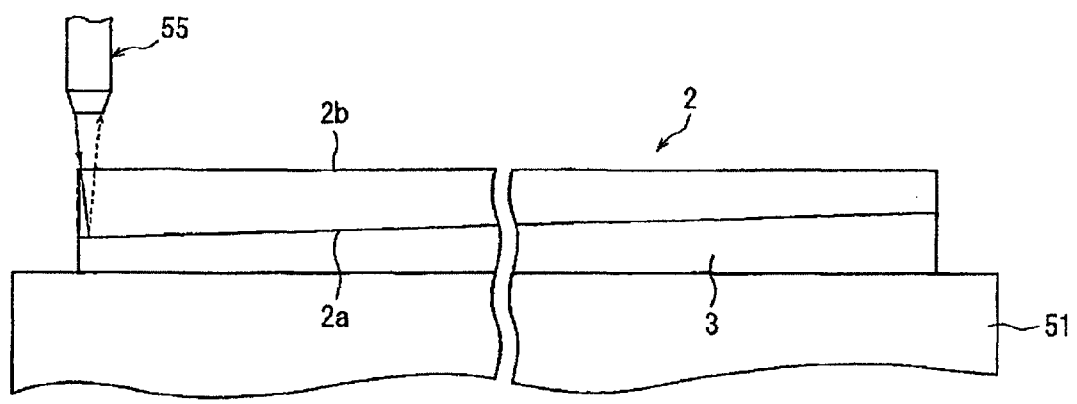
FIGS. 11A and 11B are side views for illustrating a height data creating step in the wafer processing method according to the present invention.
Figure 11B:
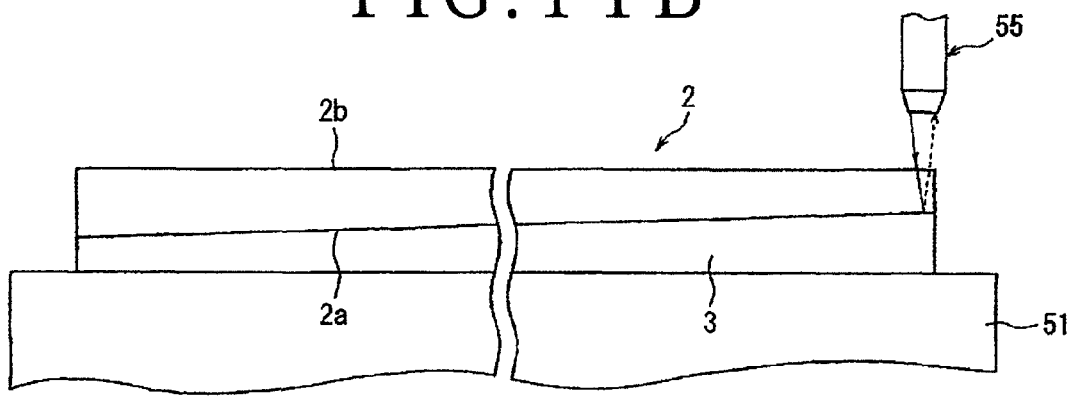
Figure 12:
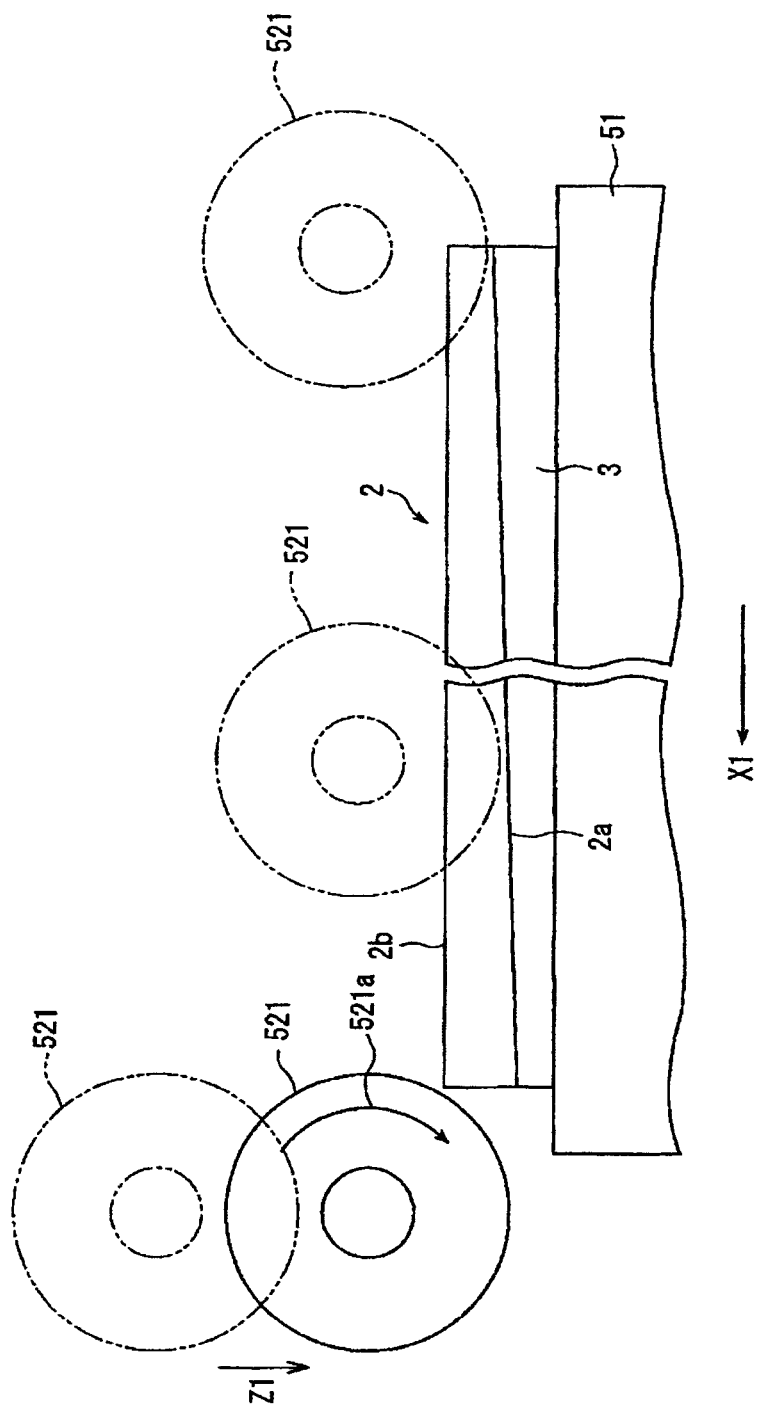
FIG. 12 is a side view for illustrating the division groove forming step to be performed according to height data created by the height data creating step shown in FIGS. 11A and 11B.

As shown in FIG. 11A, one end (left end as viewed in FIG. 11A) of a predetermined one of the streets 21 formed on the front side 2a of the semiconductor wafer 2 held through the protective tape 3 on the chuck table 51 is positioned directly below the height measuring means 55. At this position, the height measuring means 55 is operated to measure the height of the front side 2a of the semiconductor wafer 2. Thereafter, data on the height of the front side 2a of the semiconductor wafer 2 measured by the height measuring means 55 is sent to the control means (not shown). Thereafter, as shown in FIG. 11B, the chuck table 51 is operated to position the other end (right end as viewed in FIG. 11B) of the predetermined street 21 directly below the height measuring means 55. At this position, the height measuring means 55 is operated to measure the height of the front side 2a of the semiconductor wafer 2. Thereafter, data on the height of the front side 2a of the semiconductor wafer 2 measured by the height measuring means 55 is sent to the control means (not shown). In this manner, the control means (not shown) inputs the data on the heights of the front side 2a of the semiconductor wafer 2 at the opposite ends of the predetermined street 21 from the height measuring means 55 and then calculates the gradient of the predetermined street 21 from the data on the heights at the opposite ends of the predetermined street 21. The data on the heights at the opposite ends of the predetermined street 21 and the gradient calculated above are stored into a memory included in the control means (not shown). This height data creating step is similarly performed to the areas corresponding to all of the streets 21 formed on the front side 2a of the semiconductor wafer 2.

After performing the height data creating step as mentioned above, the division groove forming step is performed according to the height data stored in the memory of the control means (not shown) in the cutting apparatus 5, this height data showing the height of the front side 2a of the semiconductor wafer 2 in the area corresponding to each street 21. More specifically, the chuck table 51 holding the semiconductor wafer 2 through the protective tape 3 is moved to the cutting area and one end of the predetermined street 21 is positioned on the slightly right side of the position directly below the cutting blade 521 as shown in FIG. 12. Thereafter, the cutting blade 521 is rotated in the direction shown by an arrow 521a in FIG. 12 and the vertically moving means (not shown) is operated to lower the cutting blade 521 by a predetermined amount from the standby position shown by a phantom line to the working position shown by a solid line in the direction shown by an arrow Z1 in FIG. 12. The working position of the cutting blade 521 is set so that the outer circumference of the cutting blade 521 is higher in position than the front side 2a of the semiconductor wafer 2 at one end of the predetermined street 21 by an amount of 10 to 15 µm, for example, wherein the data on the height of the front side 2a has already been created in the height data creating step. After lowering the cutting blade 521 to the working position as mentioned above, the chuck table 51 is moved in the direction shown by an arrow X1 in FIG. 12 at a predetermined feed speed (e.g., 50 mm/s) as rotating the cutting blade 521 in the direction of the arrow 521a. During the movement of the chuck table 51 in the direction of the arrow X1 shown in FIG. 12, the vertically moving means (not shown) is controlled according to the gradient data created in the height data creating step to vertically move the cutting blade 521 along the varying height of the front side 2a of the semiconductor wafer 2 as shown by phantom lines in FIG. 12, thereby controlling the depth of cut by the cutting blade 521. As a result, the back side 2b of the semiconductor wafer 2 is cut along the predetermined street 21 by the cutting blade 521 to form a division groove so that a uniform predetermined thickness (e.g., 10 to 15 µm) is left between the bottom of the division groove and the front side 2a of the semiconductor wafer 2.

This division groove forming step is similarly performed along all of the streets 21 formed on the semiconductor wafer 2, and the wafer dividing step is next performed.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method of dividing a wafer formed of a wafer material along a plurality of crossing streets formed on the front side of said wafer to thereby partition a plurality of regions where a plurality of devices are respectively formed, said wafer processing method comprising:
    a protective member attaching step of attaching a protective member to the front side of said wafer;
    a division groove forming step of cutting the back side of said wafer along each street by using a cutting blade after performing said protective member attaching step to thereby form a division groove along each street with an uncut predetermined thickness of said wafer material being left between the bottom of said division groove and the front side of said wafer;
    a wafer supporting step of attaching the back side of said wafer to a dicing tape supported to an annular frame and peeling said protective member from the front side of said wafer after performing said division groove forming step; and
    a wafer dividing step of applying an external force to said wafer attached to said dicing tape after performing said wafer supporting step to thereby divide said wafer into said individual devices by breaking said uncut predetermined thickness of said wafer material along said streets where said division grooves are respectively formed.

2. The wafer processing method according to claim 1, further comprising a back grinding step of grinding the back side of said wafer after performing said protective member attaching step and before performing said division groove forming step to thereby reduce the thickness of said wafer to a finished thickness of each device.

3. The wafer processing method according to claim 2, further comprising a height data creating step of creating height data by measuring the height of the front side of said wafer in the area corresponding to each street after performing said back grinding step and before performing said division groove forming step; said division groove forming step being performed by controlling said cutting blade according to said height data created in said height data creating step to thereby form said division groove along each street with said predetermined thickness left between the bottom of said division groove and the front side of said wafer.

4. The wafer processing method according to claim 1, wherein said predetermined thickness is about two to three times the thickness of a device layer that forms devices on said wafer.

5. The wafer processing method according to claim 1, wherein said predetermined thickness is between 10 μm and 15 μm.

6. The wafer processing method according to claim 1, wherein said wafer dividing includes a dicing tape expanding step for applying said external force, and further wherein said external force is applied in the radial direction of the wafer.

7. A wafer processing method of dividing a wafer along a plurality of crossing streets formed on the front side of said wafer to thereby partition a plurality of regions where a plurality of devices are respectively formed, said wafer processing method comprising:
- a protective member attaching step of attaching a protective member to the front side of said wafer;
- a division groove forming step of cutting the back side of said wafer along each street by using a cutting blade after performing said protective member attaching step to thereby form a division groove along each street with a predetermined thickness left between the bottom of said division groove and the front side of said wafer;
- a wafer supporting step of attaching the back side of said wafer to a dicing tape supported to an annular frame and peeling said protective member from the front side of said wafer after performing said division groove forming step;
- a wafer dividing step of applying an external force to said wafer attached to said dicing tape after performing said wafer supporting step to thereby divide said wafer into said individual devices along said streets where said division grooves are respectively formed;
- a back grinding step of grinding the back side of said wafer after performing said protective member attaching step and before performing said division groove forming step to thereby reduce the thickness of said wafer to a finished thickness of each device; and
- a height data creating step of creating height data by measuring the heights of a plurality of areas on the front side of said wafer in the area corresponding to each street after performing said back grinding step and before performing said division groove forming step; said division groove forming step being performed by controlling said cutting blade according to said height data created in said height data creating step to thereby form said division groove along each street with said predetermined thickness left between the bottom of said division groove and the front side of said wafer.

8. The wafer processing method according to claim 7, wherein said predetermined thickness is about two to three times the thickness of a device layer that forms devices on said wafer.

9. The wafer processing method according to claim 7, wherein said predetermined thickness is between 10 μm and 15 μm.

10. The wafer processing method according to claim 7, wherein said wafer dividing includes a dicing tape expanding step for applying said external force, and further wherein said external force is applied in the radial direction of the wafer.

* * * * *